United States Patent
Okamoto et al.

(10) Patent No.: US 7,097,709 B2
(45) Date of Patent: Aug. 29, 2006

(54) LASER ANNEALING APPARATUS

(75) Inventors: Tatsuki Okamoto, Tokyo (JP); Tetsuya Ogawa, Tokyo (JP); Yukio Sato, Tokyo (JP); Junichi Nishimae, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 76 days.

(21) Appl. No.: 10/305,339

(22) Filed: Nov. 27, 2002

(65) Prior Publication Data

US 2004/0099209 A1    May 27, 2004

(51) Int. Cl.
*C30B 1/08* (2006.01)

(52) U.S. Cl. .................... 117/201; 117/202; 117/204; 117/205; 117/904

(58) Field of Classification Search ............. 117/201, 117/202, 204, 205, 904
See application file for complete search history.

(56) References Cited

U.S. PATENT DOCUMENTS 5,529,951 A    6/1996  Noguchi et al.
6,014,401 A *  1/2000  Godard et al. ............. 372/97
6,326,219 B1  12/2001  Markle et al.
6,437,284 B1   8/2002  Okamoto et al.
6,566,683 B1   5/2003  Ogawa et al.
6,717,105 B1   4/2004  Okamoto et al.

FOREIGN PATENT DOCUMENTS

| EP | 1 256 977 | 11/2002 |
| JP | 04-282869 | * 10/1992 |
| JP | 11-186163 | 7/1999 |
| JP | 2000-012484 | 1/2000 |
| WO | WO 02/31871 A1 | 4/2002 |

OTHER PUBLICATIONS

U.S. Appl. No. 09/708,608, filed Mar. 8, 2000, Mitsubishi Electric.

* cited by examiner

*Primary Examiner*—Robert Kunemund
(74) *Attorney, Agent, or Firm*—Leydig, Voit & Mayer, Ltd.

(57) ABSTRACT

A laser annealing apparatus for crystallizing a semiconductor film with a linearly radiating laser beam including a laser oscillator and laser optical systems for forming a laser beam radiated from the laser oscillator linearly, for application to a semiconductor film. Each linearly radiating laser beam from each laser optical system radiated onto the semiconductor film is arrayed almost linearly in a length direction, with an interval on the semiconductor film.

8 Claims, 5 Drawing Sheets

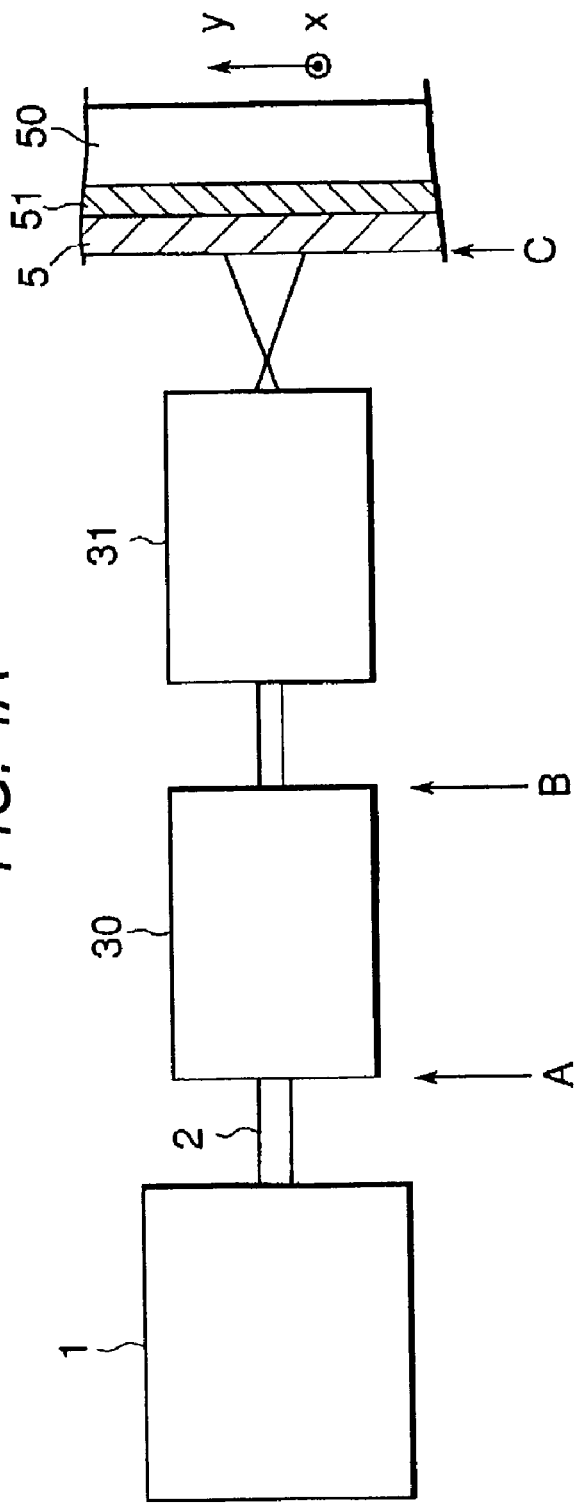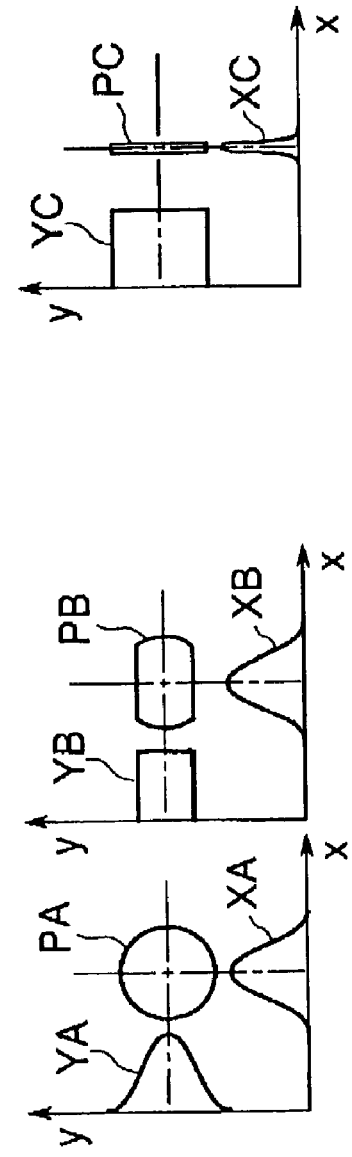

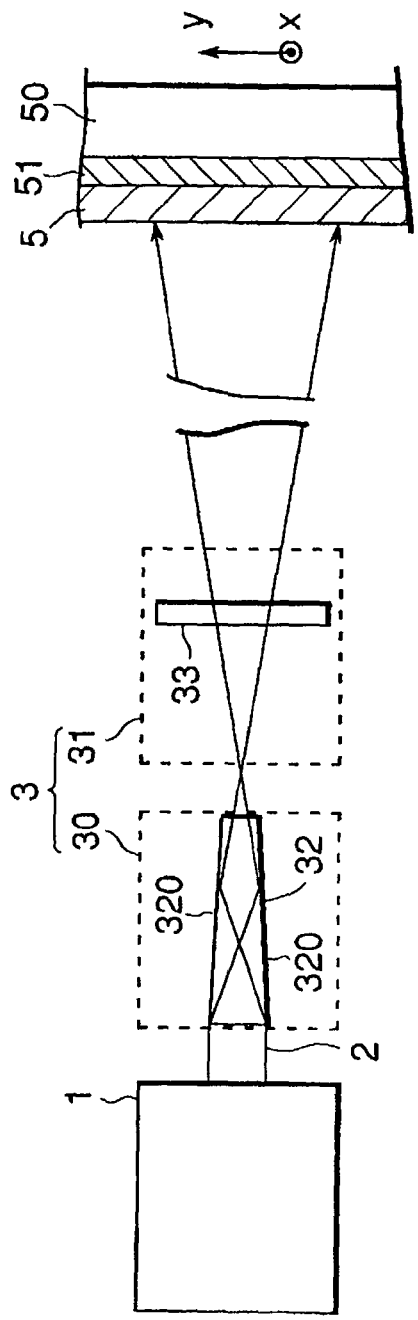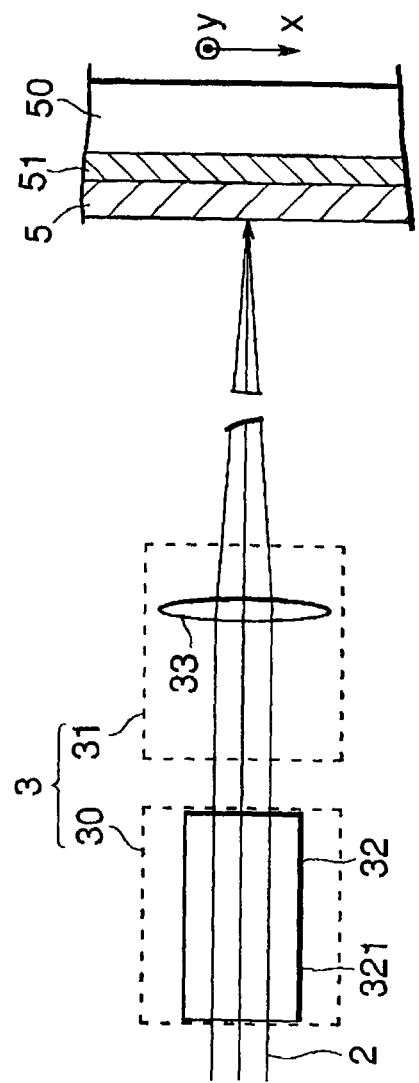

LASER ANNEALING APPARATUS

BACKGROUND OF THE INVENTION

1. Field of the Invention

The present invention relates to a polycrystalline semiconductor film having excellent crystallinity, and more particularly to a laser heat treatment apparatus for forming a silicon film.

2. Related Art

A pixel portion of a liquid crystal display makes up an image by switching thin film transistors made from an amorphous or polycrystalline silicon film formed on a substrate of glass or composite quartz. However, due to low crystallinity of the silicon film constituting an active layer of the transistors, the thin film transistors are low in performance, typically in mobility. Therefore, it has been difficult to fabricate an integrated circuit requiring high speed and high functionality.

Thus, to realize a thin film transistor with high mobility, a method for improving the crystallinity of a silicon film involves a laser heat treatment of radiating a laser to the silicon film formed on the substrate to enhance the crystallinity.

The pixel transistors in the pixel portion of the liquid crystal panel are driven by a driver circuit that is usually separate, but the driver circuit should be constructed in proximity to the pixel transistors at the same time if high speed and high functionality of the polycrystalline silicon film are to be realized. If this is possible, there is a remarkable advantage in terms of the manufacturing cost and reliability of the liquid crystal panel.

The relationship between the crystallinity of silicon film and the mobility of thin film transistor is described below. The silicon film produced through the laser heat treatment is typically polycrystalline. A grain boundary of polycrystal is made up of lattice defects, which scatter the carriers in the active layer of the thin film transistor to impede the movement. Accordingly, to enhance the mobility of the thin film transistor, it is important to reduce the frequency of carriers traversing the grain boundary in moving through the active layer. Therefore, it is required to decrease the density of lattice defects. The laser heat treatment is aimed at forming the polycrystalline silicon film having large crystal grain diameter and with less lattice defects on the grain boundary from the amorphous silicon film formed on the substrate.

The present inventors proposed an optical system for laser heat treatment in the Unexamined Japanese Patent Application Publication No. Hei 11-179233, in which a laser beam from a laser oscillator is distributed linearly on the surface of silicon film through the optical system, and the linear beam is swept relatively on the silicon film in its orthogonal direction.

FIGS. 4 and 5 are typical views of the laser optical system 3. A laser beam 2 radiated from the laser oscillator 1 is passed through intensity distribution forming means 30 and beam shape forming means 31 to illuminate the silicon film 5 formed on the substrate 50.

The laser beam 2 radiated from the laser oscillator 1 typically shows Gaussian intensity distribution. The intensity distribution forming means 30 preserves the Gaussian intensity distribution in the x direction of the beam, and smoothes the intensity distribution only in the y direction of the beam.

The laser beam with such a top hat distribution is adjusted in the magnification of laser beam length in the x and y directions by the beam shape forming means 31, and the beam shape is made rectangular or linear on the amorphous or polycrystalline silicon film 5. If the longitudinal direction of rectangular laser beam is taken as the y direction, the intensity distribution XC in the x direction on the upper face C of the silicon film 5 has a reduced shape of the intensity distribution XA in the x direction on a plane of incidence A for the intensity distribution shaping means 30, still preserving a property of directivity of the oscillating laser beam 2, while the intensity distribution YC in the y direction is almost uniform on the upper face C of silicon film.

On the other hand, the silicon film 5 as the subject of laser radiation is formed on a silicon oxide film as an under-layer film 51 on the substrate 50 made of glass, which is fixed on a scanning stage, and heated by radiation of the laser beam while the laser beam of rectangular shape is being moved in the x direction.

If the laser beam of rectangular shape is applied onto the surface of the silicon film 5 formed on the substrate while sweeping it in the x direction, the silicon film 5 is heated by absorbing the laser beam, and melted in a rectangular shape. At this time, there is no temperature gradient in the longitudinal direction or the y direction of radiating laser beam because the intensity distribution of laser beam 2 is uniform, but there is some temperature gradient caused by the cooling in the sweep direction or x direction. When the melted silicon film is crystallized by the cooling, the crystal grows in accordance with the temperature gradient, causing one dimensional growth (one directional growth) in the movement direction or the x direction of the substrate 50, so that the crystal grains having a grain diameter of about several μm are formed along the sweeping direction.

If the rectangular or linear beam is employed for the laser heat treatment, the intensity distribution in the width direction of laser beam has a great effect on a recrystallizing growth process, and the intensity distribution in the longitudinal direction governs the area where the crystal grows, whereby an appropriate beam profile and the intensity of radiation must be chosen to fabricate the thin film transistor having excellent characteristics. However, the optical system for forming the rectangular beam has a limited laser output, and to obtain a required intensity of radiation, it is necessary to shorten the length of radiating laser beam in the longitudinal direction, resulting in lower productivity.

SUMMARY OF THE INVENTION

The present invention is achieved in the light of the above-mentioned problems, and it is an object of the invention to provide a laser annealing apparatus that can form a silicon thin film having a small density of lattice defects and a high crystallinity through the laser annealing process, with high productivity of silicon thin films.

The present invention provides a laser annealing apparatus comprising a laser oscillator, and a laser optical system for forming a laser beam radiated from the laser oscillator linearly to be applied onto an amorphous or polycrystalline semiconductor film, the laser annealing apparatus crystallizing the semiconductor film with the linearly radiating laser beam, characterized in that the apparatus has a plurality of laser optical systems, wherein each linearly radiating laser beam from each laser optical system onto the semiconductor film is arrayed almost linearly in a length direction with a certain interval on the surface of the semiconductor film. A plurality of area rows can be crystallized by sweeping at a time, whereby the efficiency can be increased, and because of some interval, there is no interference between linear radiating laser beams, whereby the crystalline film with less defects can be surely produced.

In the laser annealing apparatus of the invention, the interval between the linear laser beams is substantially equal to or slightly smaller than the width of linear laser beams.

In particular, it is preferred that the interval d between the linear laser beams is set to meet the relation $$(w+d) \times n \geq L$$

where n is the number of laser beams, w is the width of linear beam, d is the interval between linear beams, and L is the width of an area for laser radiation on the substrate. With this interval between the radiating laser beams, after the first pass, the radiating laser beams are directed toward this interval at the second pass, thereby making the polycrystallization.

The laser annealing apparatus of the invention is preferably employed to form the polycrystalline silicon film having uniform and large crystal grains, which is used for the substrate to form the fast thin film transistor for a pixel portion for the liquid crystal display.

The laser oscillator preferably radiates a laser beam having an oscillation wavelength of 350 to 800 nm. The laser beam with this wavelength is preferable in the respect of uniformly heating the silicon film in the thickness direction. Particularly, the laser oscillator employs the harmonics of a solid-state laser.

BRIEF DESCRIPTION OF THE DRAWINGS

FIGS. 4A to 4D show a laser optical system for laser heat treatment underlying the laser annealing apparatus of the invention.

FIGS. 5A and 5B show structures of the laser optical system for laser heat treatment.

DETAILED DESCRIPTION OF THE PREFERRED EMBODIMENTS

Embodiment 1

Figure 1:
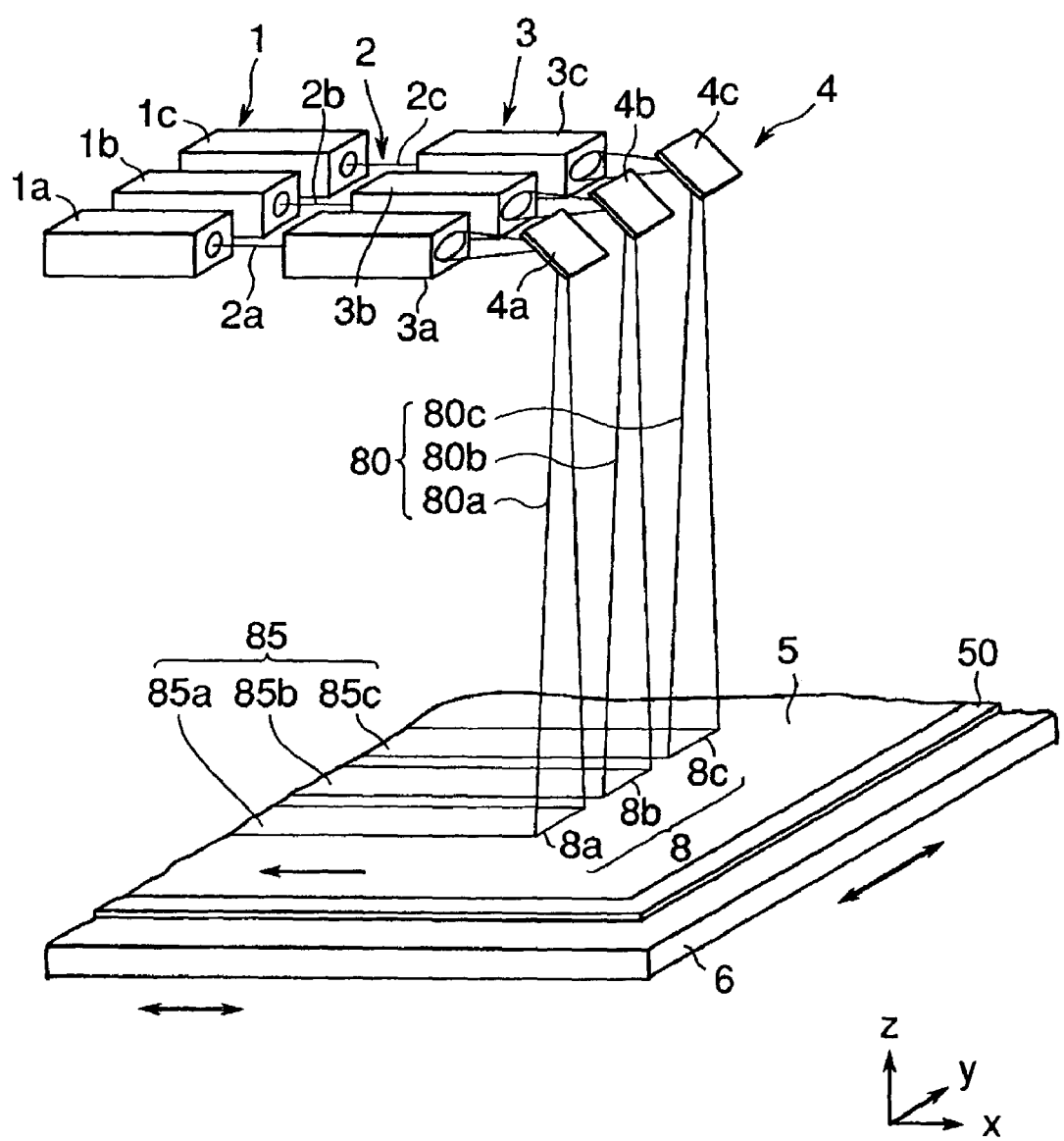
FIG. 1 is a typical perspective view of a laser annealing apparatus according to an embodiment of the present invention.

A laser annealing apparatus of this embodiment comprises three laser oscillators 1a to 1c, and three laser optical systems having the linear beam forming means 3a to 3c and the reflecting mirrors 4a to 4c that are arranged so that the beam optical axes may be substantially horizontal, the reflecting mirrors 4a to 4c being disposed above a substrate 50 on a stage 6, as shown in FIG. 1.

The laser beams 2 (2a to 2c) are radiated from three laser oscillators 1 (1a to 1c) toward the linear beam forming means 3 (3a to 3c) as the corresponding laser optical systems, and each of the linear beam forming means 3a to 3c forms the laser beam to have a linear profile of beam on the silicon film. The beams from the linear beam forming means 3 (3a to 3c) are reflected from the reflecting mirrors 4 (4a to 4c), respectively, and applied vertically on the surface of the silicon film 5.

Each of the linear beam forming means 3 forms the laser beam 2 so that radiating laser beam 8a, 8b and 8c is a linear beam on the silicon film on the substrate. As one example, the linear beam forming means 3 is composed of a waveguide 32 having the opposed reflecting surfaces and a cylindrical convex lens 33, as shown in FIG. 5.

FIG. 5 shows one example of the simplest laser optical system 3, in which the intensity distribution forming means 30 comprises the waveguide 32 having a pair of reflecting surfaces 320, 320 that are tapered and opposed in the y direction, and the beam shape forming means 31 comprises the cylindrical lens 33 in the x direction. The incident laser beam 2 into the optical waveguide 32 has the y component reflected multiply between one pair of reflecting surfaces 320, 320 for the waveguide 32, and synthesized into even intensity distribution to pass through the cylindrical convex lens 33 toward the silicon film 5, while the x component of the incident laser beam 2 passes between the pair of reflecting surfaces for the waveguide 32 to be focused on the silicon film by the cylindrical convex lens 33. In this way, the radiating laser beam is narrowed in width with the intensity distribution that is uniform and long in the y direction and sharp in the x direction, and has a linear shape on the silicon film. Since the laser beam is swept in the x direction, the silicon film is heated and melted, and then cooled.

In this embodiment, radiating laser beams 8a, 8b and 8c are arrayed almost linearly, with an interval from each other, on the silicon film 5 on the substrate. The linearly radiating laser beams 8a, 8b and 8c applied on the silicon film are swept in its width direction (x direction in FIG. 1), the illuminated areas 85a, 85b and 85c radiated by laser on the silicon film are arrayed with an interval from each other, and crystallization occurs by heating and melting and through the cooling process in the illuminated areas 85a, 85b and 85c. On the other hand, the interval between each of the illuminated areas 85a, 85b and 85c still remains uncrystallized, but is swept by the next radiating laser beams 8a, 8b and 8c, and thereby crystallized.

In this embodiment, the laser beams 2a, 2b and 2c radiated from the plurality of laser oscillators 1a, 1b and 1c pass through the linear beam forming means to be applied on the semiconductor film on the substrate at the same time. While the radiating laser beams 8a, 8b and 8c have a required radiation intensity, the radiation area can be increased in accordance with the number of radiating laser beams, resulting in higher productivity. And the laser oscillators and the beam forming means can be arranged on a frame of apparatus, with an appropriate spacing from each other, thereby preventing interference from each other.

The laser oscillator of this invention is more effective to radiate the laser beam having an oscillation wavelength from 330 to 800 nm. For the laser beam in this wavelength range, the amorphous silicon has a relatively small absorption coefficient, and the laser beam is penetrated in a direction of film thickness, so that the substrate is heated almost evenly in the direction of film thickness. Thereby, the temperature distribution in the transverse direction within the silicon film to be developed by laser radiation is limited in the x direction. Accordingly, the silicon film on the substrate is melted uniformly in depth direction by a portion of the beam above a certain intensity.

As above described, since the silicon film can be heated uniformly in the thickness direction, coarse crystal grains can be produced on the silicon film through the laser heat treatment, whereby it is possible to produce the silicon thin film having excellent crystallinity to fabricate the thin film transistor with a small density of lattice defects.

For the laser beam having an oscillation wavelength from 340 to 800 nm, a harmonics generating source for a solid-state later is preferably employed. For the solid-state laser, a second harmonic (532 nm) or a third harmonic (355 nm) for the Nd:YAG laser, a second harmonic (524 nm) or a third harmonic (349 nm) for the Nd:YLF laser, and a second harmonic (515 nm) or a third harmonic (344 nm) for the Yb:YAG laser may be used. A fundamental harmonic or second harmonic of Ti: sapphire laser may be employed. This solid-state laser as the harmonics generating source can be used to generate a laser beam having an oscillation wavelength in a range from 340 to 800 nm efficiently, employing a compact apparatus to enable the stable operation over the long time On the other hand, the silicon film subjected to laser treatment is specified in size and shape corresponding to its uses. The substrate 50 is made of glass or ceramics, and an insulating layer, for example, a silicon oxide film, is formed as the under-layer film on the substrate. The silicon oxide film can be formed by CVD (Chemical Vapor Deposition). The thickness is in a range from 100 to 300 nm, and particularly about 200 nm.

The amorphous silicon film to be treated is formed on the silicon oxide film as the under-layer by LPCVD (Low Pressure Chemical Vapor Deposition) in accordance with its uses, in which the thickness is in a range from 30 to 100 nm, and particularly about 50 nm. The silicon film maybe amorphous or crystalline. The substrate 50 formed with the silicon film is laid and secured on the stage.

The silicon film is radiated by linearly radiating laser beam while being moved relatively in the width direction or x direction. The relative movement is made in such a manner that the stage is moved in two directions relative to the fixed optical system or the laser optical system is moved with the stage fixed.

If the laser beam is applied onto the silicon film during the relative movement, the silicon film is heated by absorbing the laser beam, and melted like rectangle corresponding to a shape of the laser beam. The melted silicon film has a temperature gradient only in the movement direction or x direction, and has no temperature gradient in the longitudinal direction or y direction of the radiating laser beam 8, because the intensity distribution of the radiating laser beam 8 is even. The melted silicon film is crystallized and grown along the temperature gradient as one dimensional growth (unidirectional growth) in the movement direction or the x direction of the substrate 50, so that crystal grains with crystal grain diameters of as large as several μm are produced.

The process of crystal growth by radiation is greatly affected by the temperature distribution formed in the x direction with in the amorphous or polycrystalline silicon film, that is, the intensity distribution of radiating rectangular beam in the width direction. Heat introduced into the amorphous or polycrystalline silicon film by laser beam radiation is uniformly dissipated into the substrate. That is, the temperature distribution in the x direction within the amorphous or polycrystalline silicon film is uniformly reduced. Accordingly, the melted silicon film is crystallized and grown from a portion where the temperature passes a melting point ahead toward a portion where the temperature decreases below the melting point later. And the growing crystal is blocked in its movement by the growth of crystallite due to occurrence of natural nucleus while the temperature is decreasing, so that crystal growth in the x direction is ceased. That is, it is required that crystal grains are grown as long as possible by the time when natural nucleus occurs. To this end, the high crystal growth rate is required.

Generally, the crystal growth rate v in a certain minute area is dependent on a ratio/of the temperature difference$\Delta T$ in the minute area to the width $\Delta x$ of the minute area, namely, temperature gradient, and represented as $v=k\Delta T/\Delta x$, where k is a rate constant.

When there is some temperature distribution in the x direction within the silicon film, the crystal growth rate can be increased if the temperature gradient is sharp in the area having the temperature of melting point or above, so that the polycrystalline silicon film having large crystal grain diameter can be form, making it possible to form the thin film having excellent crystallinity required to fabricate the thin film transistor with high performance.

In the apparatus as shown in this embodiment, the second laser beam 2b and the third laser beam 2c radiated from the second laser oscillator 1b and the third laser oscillator 1c are converted into linear form like the first laser beam 2a, and applied as linear beams on the amorphous or polycrystalline silicon film formed on the substrate 50. In this manner, the laser beams 2a, 2b and 2c radiated from the plurality of laser oscillators 1a, 1b and 1c are applied on the substrate at the same time, thereby increasing the radiation area with a required radiation intensity kept, and resulting in higher productivity.

If a wide area on the substrate is subjected to the laser radiation, the first to third radiating laser beams 8a to 8c are arrayed in almost linear form with an appropriate interval from each other in the y direction. The radiating laser beams are spaced from each other, and moved a certain distance in the x direction on the surface of silicon film. After the end of the movement, the laser beams are moved in the y direction by a distance equal to or slightly smaller than the width of beam, and moved in the x direction again. The laser beams are applied over the entire area of the substrate required for laser radiation. At this time, the amount of movement in the y direction through one pass is smaller than when the radiating laser beams are not spaced, and because the radiating laser beams are spaced, the plurality of laser optical systems including the linear beam forming means can be arranged with distance, thereby preventing interference between optical parts.

Embodiment 2

Figure 2:
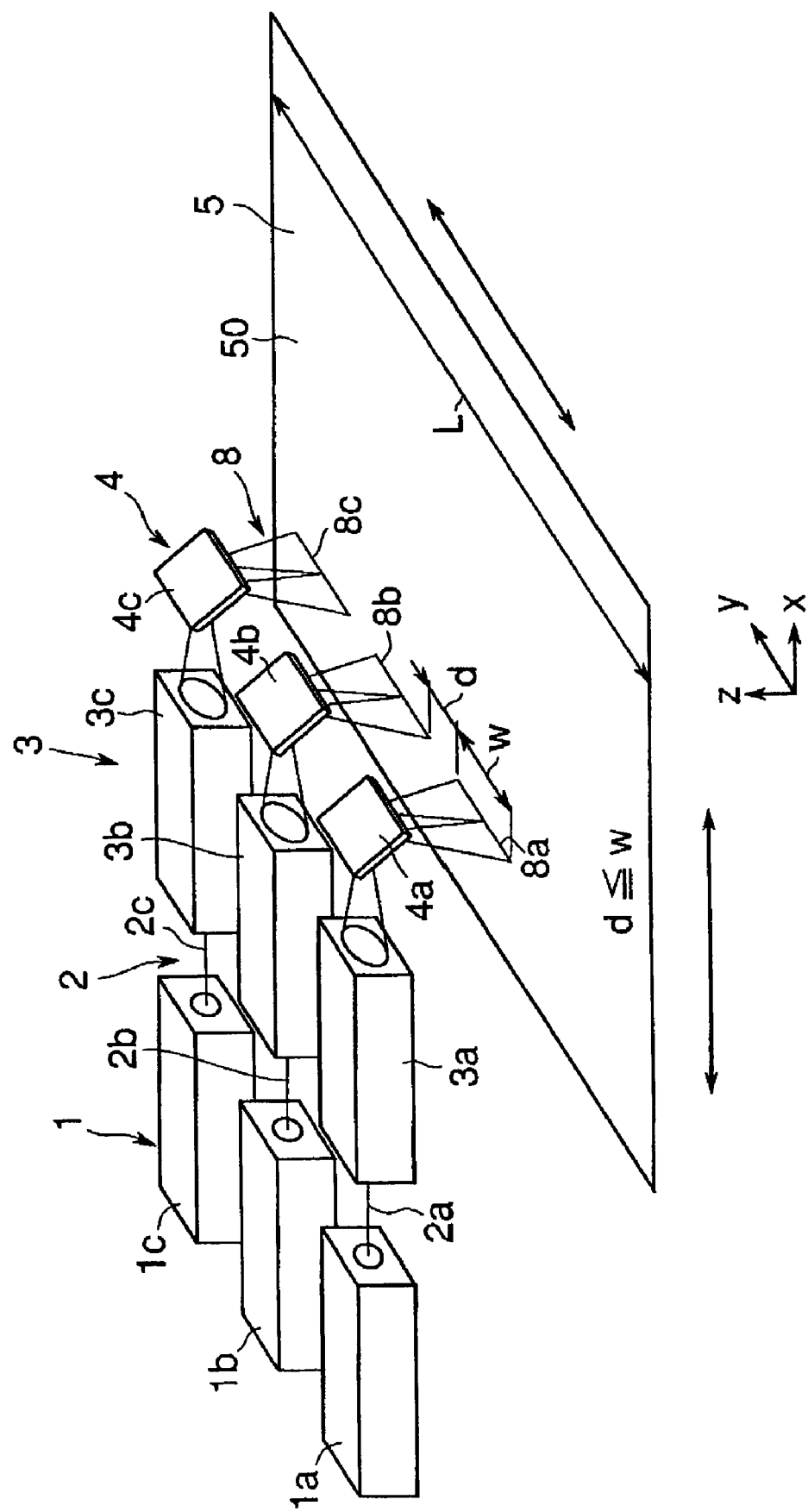
FIG. 2 is a typical perspective view of a laser annealing apparatus according to another embodiment of the invention.

FIG. 2 is a typical perspective view of an optical system for the laser annealing apparatus according to an embodiment 2 of this invention. In this embodiment 2, the radiating laser beam interval d is set to be equal to or slightly smaller than the radiating laser beam width w. In addition, the structure of the laser optical system and the action and function of radiating laser beams on the amorphous or polycrystalline silicon film are the same as described in the embodiment 1.

With this arrangement of radiating laser beams, after the first scanning pass, the amount of movement of the silicon film in the y direction is made almost equal to the radiating laser beam interval d, whereby the laser beams can be applied on the substrate over the area width L required for laser radiation, resulting in the even heat treatment.

Embodiment 3

Figure 3:
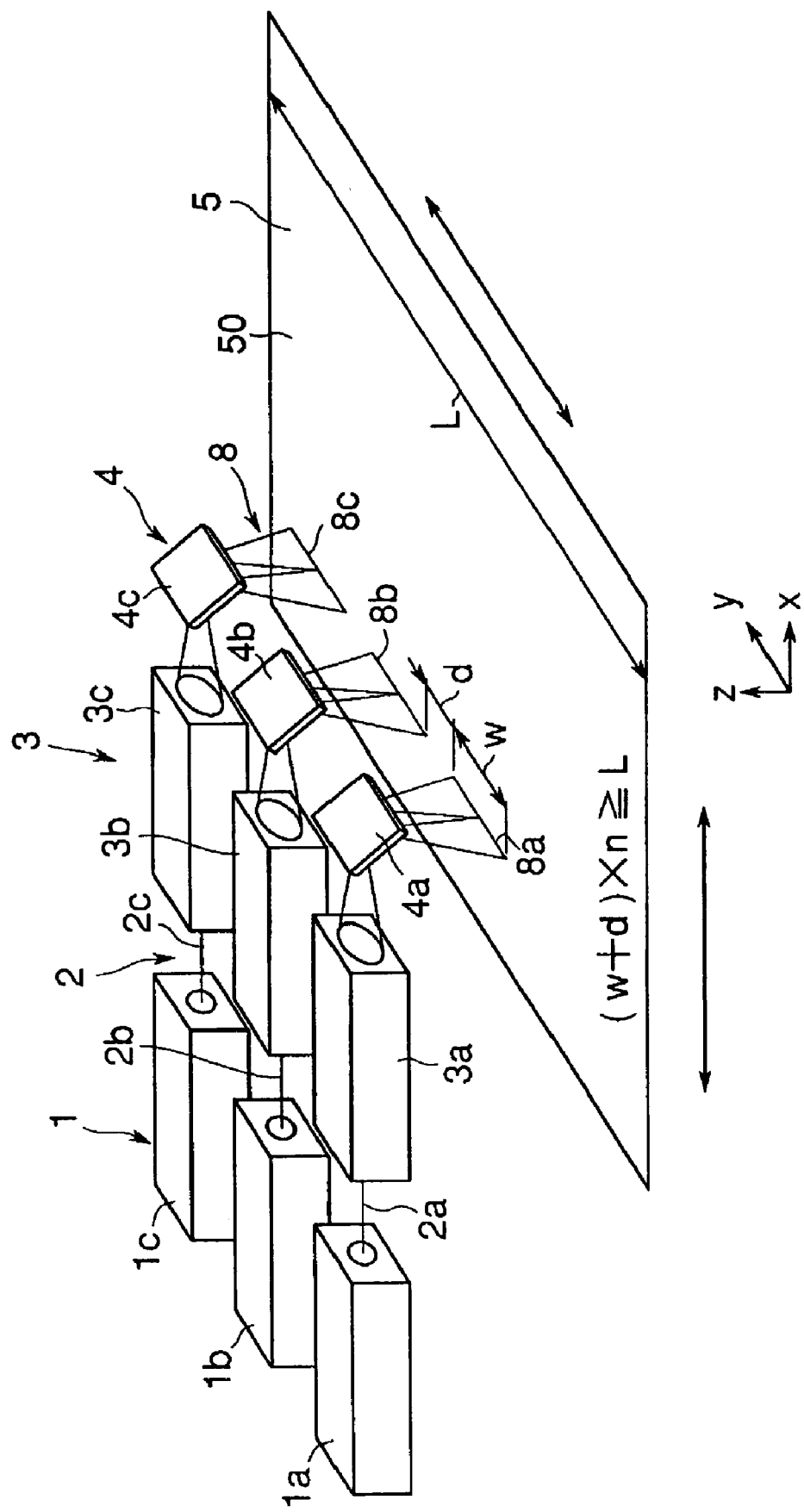
FIG. 3 is a typical perspective view showing the arrangement of the laser annealing apparatus according to another embodiment of the invention.

In this embodiment 3, the interval d between the linearly radiating laser beams is set to meet the relation $$(w+d) \times n \geq L$$

where w is the laser beam width, d is the laser beam interval, L is the area width for laser radiation on the substrate, and n is the number of laser beams, as shown in FIG. 3. In this embodiment 3, the structure of the laser optical system and the action and function of radiating laser beams on the amorphous or polycrystalline silicon film are also the same as described in the embodiment 1.

With the above array of radiating laser beams, the spacing between laser optical systems for the plural laser beams can be maximized, whereby the plurality of laser optical systems including the linear beam forming means can be arranged with distance, thereby preventing interference between optical parts. The amount of movement for the substrate 50 in the y direction through one pass can be reduced to them in minimum interval, thereby stabilizing the operation of a movement mechanism in the y direction.

With the present invention, the laser annealing apparatus employs a plurality of laser beams to be directed with an interval onto the semiconductor film, whereby the radiation area through one pass can be increased to enhance the productivity for the polycrystalline semiconductor film. And the laser optical system having the plurality of linear beam forming means can be arranged with a distance, thereby preventing the interference between optical parts.

The interval between the linear laser beams is substantially equal to or slightly smaller than the width of linear laser beams. Thereby, the laser beam can be directed in the area width L on the entire substrate, whereby the uniform heat treatment can be made.

The interval between the linear laser beams is set to meet the relation $$(w+d) \times n \geq L$$

where n is the number of laser beams, w is the width of linear beam, d is the interval between linear beams, and L is the width of an area for laser radiation on the substrate. Thereby, the interval between the laser beams in the laser optical system can be maximized, so that the laser optical system having the plurality of linear beam forming means can be arranged with a distance, thereby preventing the interference between optical parts. The amount that the substrate 50 formed with the amorphous or polycrystalline semiconductor film is moved in the y direction at a time is minimized in the interval, thereby stabilizing the operation of a movement mechanism in the y direction.

If the amorphous silicon film is formed on the substrate, the polycrystalline semiconductor film can be mass-produced with less lattice defects, whereby the silicon substrate with high performance can be produced for the thin film transistor for the liquid crystal display.

If the laser oscillator uses an oscillation wavelength from 350 to 800 nm, the amorphous or polycrystalline silicon film can be heated uniformly in the thickness direction, whereby the thin film having excellent crystallinity can be produced through the laser heat treatment, and employed to fabricate the thin film transistor with high performance.

If the laser oscillator employs the harmonics of a solid-state laser, the laser oscillator can be compact, and the amorphous or polycrystalline silicon film can be heated uniformly in the thickness direction. Accordingly, it is possible to produce the thin film having excellent crystallinity required to fabricate the thin film transistor with high performance by the laser heat treatment.

What is cliamed is:

1. A laser annealing apparatus for crystallizing a semiconductor film with a plurality of linear laser beams, the apparatus comprising:
    a plurality of laser oscillators arranged side-by-side and spaced apart from each other for producing respective laser beams;
    a stage for supporting and moving a substrate having a generally planar surface in a movement plane generally parallel to the planar surface; and
    a plurality of linear beam forming members for forming corresponding laser beams radiated from respective laser oscillators into laser beams linearly incident on the planar surface of a substrate mounted on the stage, wherein
        the plurality of laser oscillators and corresponding linear beam forming members are arranged so that optical axes of the laser beams are substantially parallel and co-planar in a first plane generally parallel to the movement plane and in a second plane generally perpendicular to the movement plane,
        the laser beams are arranged side-by-side along a straight line on the planar surface, and
        the stage is positioned relative to the linear beam forming members so that each respective closest pair of laser beams, where incident on the planar surface, are spaced apart from each other.

2. The laser annealing apparatus according to claim 1 including a reflecting mirror for deflecting each laser beam from the first plane to the second plane.

3. The laser annealing apparatus according to claim 2 wherein the mirror comprises a plurality of mirrors corresponding to respective laser oscillators.

4. The laser annealing apparatus according to claim 1, wherein the stage is positioned relative to the plurality of laser oscillators so that separation between each respective closest pair of the laser beams incident on the planar surface, along the straight line, is no larger than the length of any of the laser beams along the straight line.

5. The laser annealing apparatus according to claim 1, wherein each respective pair of closest laser beams incident on the planar surface, along the straight line, are uniformly separated by a distance d, n laser beams irradiate the planar surface, each laser beam has a width w along the straight line, L is the width of the planar surface along the straight line, and the stage is positioned relative to the linear beam forming members so that $(w+) \times n \geq L$.

6. The laser annealing apparatus according to claim 1, wherein each laser oscillator includes a pulsed laser and produces light having a wavelength in a range from 330 to 800 nm.

7. The laser annealing apparatus according to claim 6, wherein each laser oscillator includes a solid-state laser and a harmonic generator producing the light having a wavelength within the range from 330 to 800 nm.

8. The laser annealing apparatus according to claim 1 wherein the laser oscillators are arranged in a common plane generally parallel to the movement plane.

* * * * *